US008831212B2

(12) United States Patent
Tseng et al.

(10) Patent No.: US 8,831,212 B2
(45) Date of Patent: Sep. 9, 2014

(54) GUIDING MODULE AND ELECTRONIC DEVICE USING THE SAME

(71) Applicants: Chang-Yi Tseng, Taipei (TW);
Kuan-Sheng Wu, Taipei (TW);
Shun-Lung Wang, Taipei (TW)

(72) Inventors: Chang-Yi Tseng, Taipei (TW);
Kuan-Sheng Wu, Taipei (TW);
Shun-Lung Wang, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 0 days.

(21) Appl. No.: 13/922,263

(22) Filed: Jun. 20, 2013

(65) Prior Publication Data

US 2014/0111915 A1    Apr. 24, 2014

Related U.S. Application Data

(60) Provisional application No. 61/717,640, filed on Oct. 24, 2012.

(30) Foreign Application Priority Data

Apr. 9, 2013    (TW) .............................. 102112518 A

(51) Int. Cl.
*H04M 1/00*    (2006.01)
*H04M 9/00*    (2006.01)
*H04M 1/02*    (2006.01)

(52) U.S. Cl.
CPC .......... *H04M 1/0235* (2013.01); *H04M 1/0214* (2013.01)
USPC ................ 379/433.12; 455/575.4; 455/575.3; 379/433.13

(58) Field of Classification Search
USPC .......... 379/433.11–433.13; 455/575.3, 575.4; 361/679.01, 679.27, 679.39, 679.55, 361/679.56; 16/327, 345, 352, 353, 362
See application file for complete search history.

(56) References Cited

U.S. PATENT DOCUMENTS

2008/0176605 A1*   7/2008   Choi et al. ..................... 455/566
2010/0093410 A1*   4/2010   Cho et al. .................... 455/575.4
2011/0211297 A1*   9/2011   Griffin et al. ............ 361/679.01

FOREIGN PATENT DOCUMENTS

CN          101586420         11/2009
CN          102347564         2/2012

\* cited by examiner

*Primary Examiner* — Tuan D Nguyen
(74) *Attorney, Agent, or Firm* — Jianq Chyun IP Office

(57) ABSTRACT

A guiding module suitable for guiding an object to pass through an opening of the guiding module and an electronic device using the same are provided. The guiding module includes a body having the opening, a pair of sliding rails and a guiding component. The object passes through the opening along an embedding direction and is embedded therewith. The sliding rails are disposed at the body, extend along the embedding direction, and are respectively located at two opposite sides of the opening. The guiding component is slidably disposed at the sliding rails and has an alignment region which includes at least one first magnetic component. When the object approaches the opening, the object located at the alignment region is magnetically attracted by the first magnetic component, and the object is embedded to the body through the opening.

20 Claims, 13 Drawing Sheets

GUIDING MODULE AND ELECTRONIC DEVICE USING THE SAME

CROSS-REFERENCE TO RELATED APPLICATION

This application claims the priority benefits of U.S. provisional application Ser. No. 61/717,640, filed on Oct. 24, 2012 and Taiwan application serial no. 102112518, filed on Apr. 9, 2013. The entirety of each of the above-mentioned patent applications is hereby incorporated by reference herein and made a part of this specification.

BACKGROUND OF THE INVENTION

1. Field of the Invention

The invention relates to a guiding module and an electronic device and, more particularly, to an electronic device applying a guiding module.

2. Description of the Related Art

With the development of semiconductors and display technology, electronic devices become smaller, multifunctional and portable. Conventional portable electronic devices include a mobile phone, a notebook and a tablet personal computer (PC). The portable electronic devices reduce the occupation space by folding to become lighter, thinner and smaller. Taking a tablet PC as an example, the conventional tablet PC is portable. However, the functional components are limited due to the small size of the tablet PC, and the functions and the expandability of the conventional tablet PC are also limited. Thus, the conventional tablet PC cannot compare to a desktop computer which has much more functions. Peripheral devices (such as a keyboard, an optical disc drive) can be installed in a desktop computer, which can only be connected to the tablet PC externally.

Thus, a docking station is provided to improve the tablet PC. The docking station includes multiple connectors, and peripheral devices, such as a keyboard, can be electrically connected to the docking station. When the user needs to use the peripheral devices, he or she combines the tablet PC and the docking station to connect the tablet PC to the peripheral devices. Thus, the users can enjoy the lightness of the tablet PC, the functionality, and the expandability of the desktop computer at the same time.

A socket combining the portable electronic device and the docking station becomes smaller as the portable electronic device becomes lighter, thinner and smaller, which makes it more difficult in aligning the socket of the docking station to the portable device. When embedding a plug is plugged to the socket in an inappropriate angle, a casing of the portable electronic device is easily scratched. When an external force is applied to the socket inappropriately, the socket may be damaged and results in bad contacting between electrodes.

BRIEF SUMMARY OF THE INVENTION

A guiding module which guides an object to pass through an opening and is embedded thereto is provided.

An electronic device is provided, a guiding module of which guides an embedding part of a first body to pass through an opening of a second body and is embedded thereto.

The guiding module is adapted for guiding an object to pass through an opening of the guiding module. The guiding module comprises a body, a pair of sliding rail and a guiding component. The body has an opening. The object passes through the opening along an embedding direction and is embedded thereto. The sliding rails disposed at the body and extending along the embedding direction are respectively disposed on two opposing sides of the opening.

A guiding component is slidably disposed at the sliding rails and has an alignment region which includes at least one first magnetic component. When the object approaches the opening, the object at the alignment region is magnetically attracted by the first magnetic component to make the object embedded to the body through the opening.

An electronic device is provided, which includes a first body and a second body. The first body includes a first connecting side and an embedding part. The embedding part is disposed at the first connecting side and protrudes from the first connecting side. The second body includes a guiding module and a second connecting side. The guiding module is disposed in the second body and is disposed at the second connecting side. The guiding module includes a body, a pair of sliding rails and a guiding component.

The body has an opening. The embedding part passed through the opening along an embedding direction and is embedded to the second body. The sliding rails disposed at the body and extending along the embedding direction to the second body are respectively disposed on two opposing sides of the opening.

A guiding component is slidably disposed at the sliding rails and has an alignment region which includes at least one first magnetic component. When the object approaches the opening, the embedding part at the alignment region is magnetically attracted by the first magnetic component to make the embedding part embedded to the second body through the opening.

DETAILED DESCRIPTION OF THE EMBODIMENTS

Figure 1:
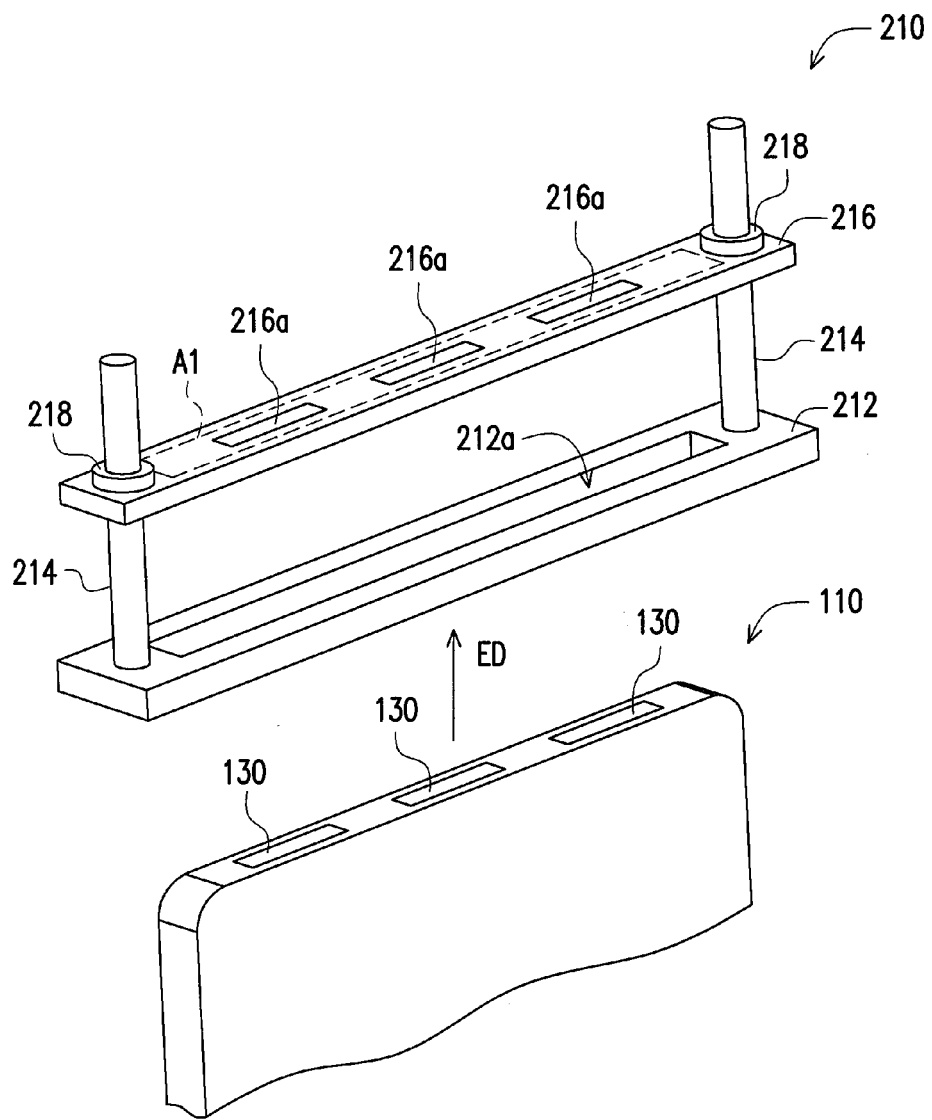
FIG. 1 is a schematic diagram showing a guiding module and an object in a first embodiment.

FIG. 1 is a schematic diagram showing a guiding module and an object in a first embodiment. As shown in FIG. 1, a guiding module 210 is adapted to guide an object 110 to pass through an opening 212a of the guiding module 210. In the embodiment, the guiding module 210 includes a body 212, a pair of sliding rails 214 and a guiding component 216. The body 212 has an opening 212a. The object 110 passes through the opening 212a along an embedding direction and is embedded thereto. In the embodiment, the object 110 is an embedding part of an embedding object, and the embedding part is embedded to the opening 212a of the guiding module. The sliding rails 214 are disposed at the body 212 and extend along the embedding direction ED, and they are respectively disposed on two opposite sides of the opening 212a. The guiding component 216 is slidably disposed at the sliding rail 214 and moves back and forth along the sliding rail 214. The guiding component 216 has an alignment region A1 which includes at least a first magnetic component 216a (three first magnetic components 216a are shown). When the object 110 approaches the opening 212a, the object 110 at the alignment region A1 is magnetically attracted by the first magnetic component 216a, and the object 110 is embedded to the body 212 through the opening 212a by the magnetic force.

As shown in FIG. 1, in the embodiment, the object 110 at least has a second magnetic component 130 (three second magnetic components 130 are shown) disposed at a surface of the object 110 facing the guiding component 216 and corresponding to the first magnetic component 216a. The second magnetic component 130 is magnetically attracted by the first magnetic component 216a, and the magnetic force between the first magnetic component 216a and the second magnetic component 130 guides the object 110 to pass through the opening 212a and embedded thereto. In the embodiment, a material of the surface of the object 110 facing the guiding component 216 includes a magnetic material. Thus, by using the characteristics of the attraction, the object 110 can be guided to pass through the opening 212a and embedded to the body 212 via the magnetic force between the first magnetic component 216a and the magnetic material without the second magnetic component 130.

In the embodiment, the guiding module 210 further includes a pair of stoppers 218 disposed at the pair of sliding rails 214, and each stopper 218 is disposed at one end of the sliding rail 214 away from the body 212. The guiding component 216 is slidably disposed at the sliding rails 214 and they can move back and forth between the body 212 and the stopper 218. When the object 110 passes through the opening 212a along the embedding direction ED, the object 110 pushes the guiding component 216 until it abuts against the stopper component 218, and the object 110 locates at an embedding position.

Figure 2A:
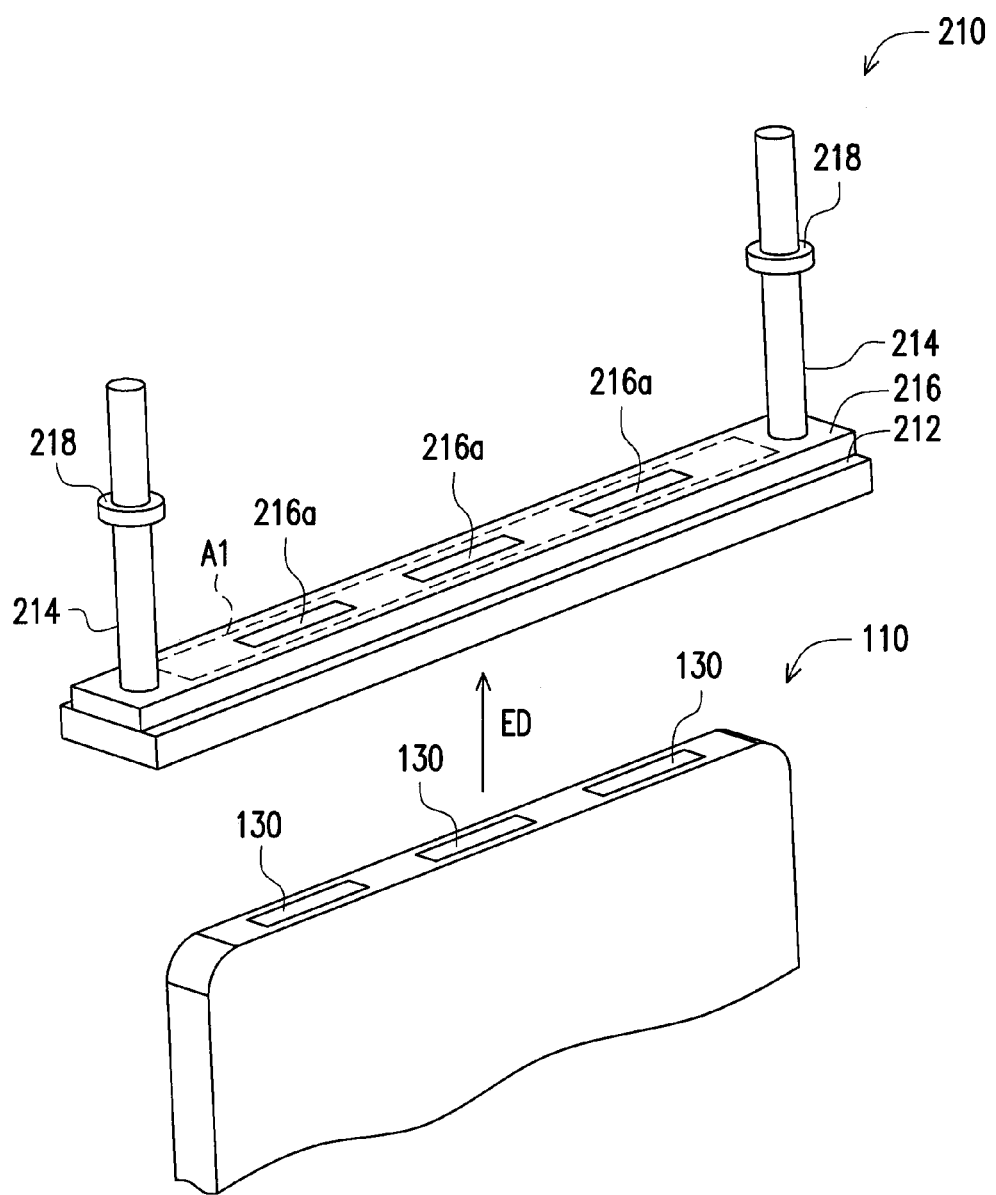
FIG. 2A to FIG. 2C are schematic diagrams showing that the guiding module guides the body to pass through the opening in FIG. 1.
Figure 2B:
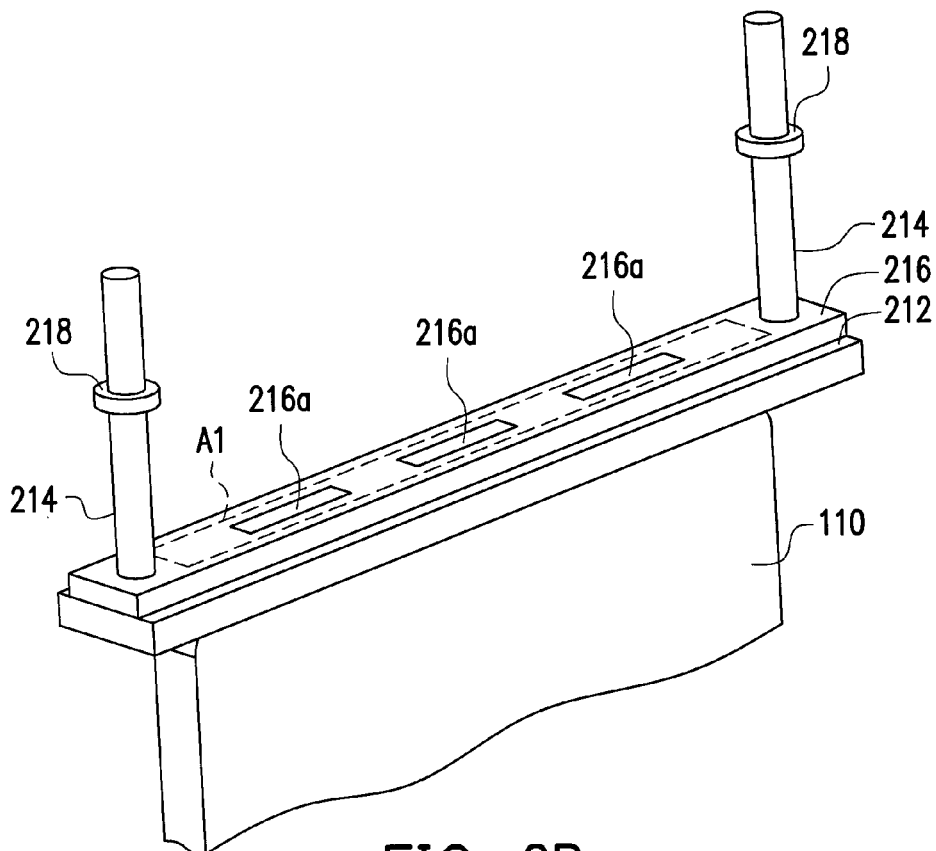
Figure 2C:
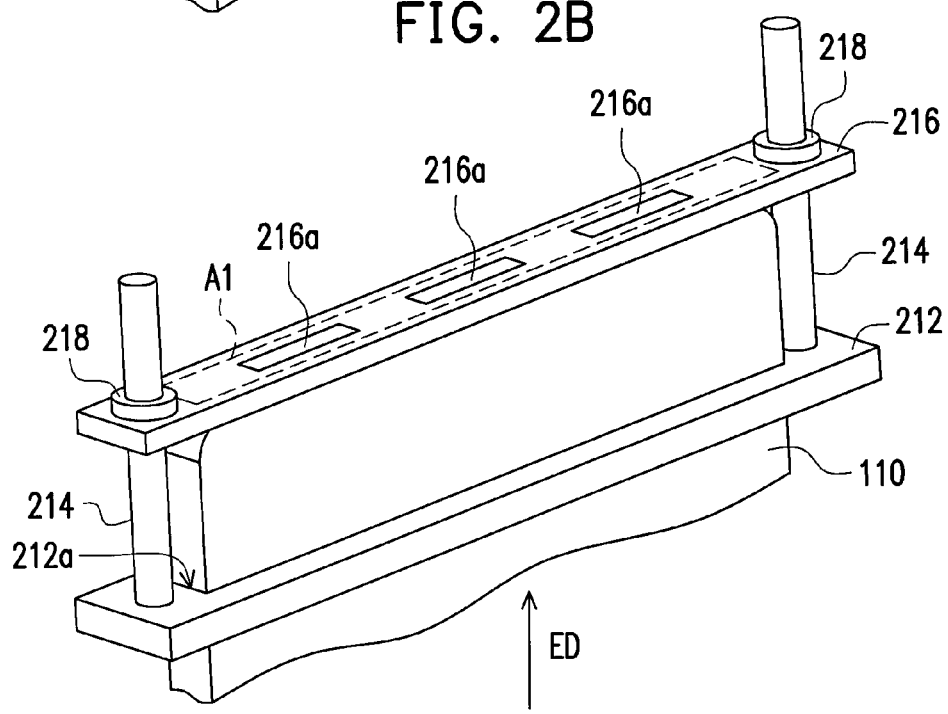

FIG. 2A to FIG. 2C are schematic diagrams showing that the guiding module guides the body to pass through the opening in FIG. 1. As shown in FIG. 2A to FIG. 2C, an original state of the guiding module 210 is shown in FIG. 2A, and the guiding component 216 abuts against the body 212. When the object 110 passes through the opening (the opening 212a as shown in the FIG. 1) of the guiding module 210, the object 110 approaches the opening of the guiding module 210, the object 110 and the guiding component 216 are located at two opposite sides of the body 212, respectively, as shown in the FIG. 2B.

Therefore, the object 110 is magnetically attracted by the first magnetic component 216a of the guiding component 216 and passes through the opening 212a to attach to the first magnetic component 216a at the other side of the body 212. Then, the object 110 pushes the guiding component 216 to move along the embedding direction ED until it abuts against the stopper 218, and the object 110 locates at an embedding position at which the object is embedded with the opening 212a.

When the object 110 is pulled away from the opening 212a, the first magnetic component 216a is magnetically attracted by the object 110 and leads the guiding component 216 to move to the position abutted against the body 212 and restore to the original state of the guiding module 210. In other words, when the object 110 is pulled away from the opening 212a, the guiding module 210 automatically restores to the original state due to the magnetic attraction force between the first magnetic component 216a and the object 110, so as to guide the object 110 when the object 110 passes through the opening 212a of the guiding module 210 next time.

As stated above, the object 110 can easily align to the opening 212a by the guiding component 216 which includes an magnetic component, and since the guiding component 216 is slidably disposed at the other side of the opening 212a, the object 110 can pass through the opening 212a via the guiding component 216 and move to the embedding position to be embedded to the opening 212a. When the object 110 is pulled away from the opening 212a, the guiding component 216 is guided by the object 110 to abut against the body 212, which is the original state as shown in the FIG. 2A, via the magnetic force between the first magnetic component 216a and the object 110.

In other words, when the object 110 is pulled away from the opening 212a, the guiding component 216 automatically restores to the original state via the magnetic force between the first magnetic component 216a and the object 110, so as to guide the object 110 when the object 110 passes through the opening 212a of the guiding module 210 next time.

Figure 3:
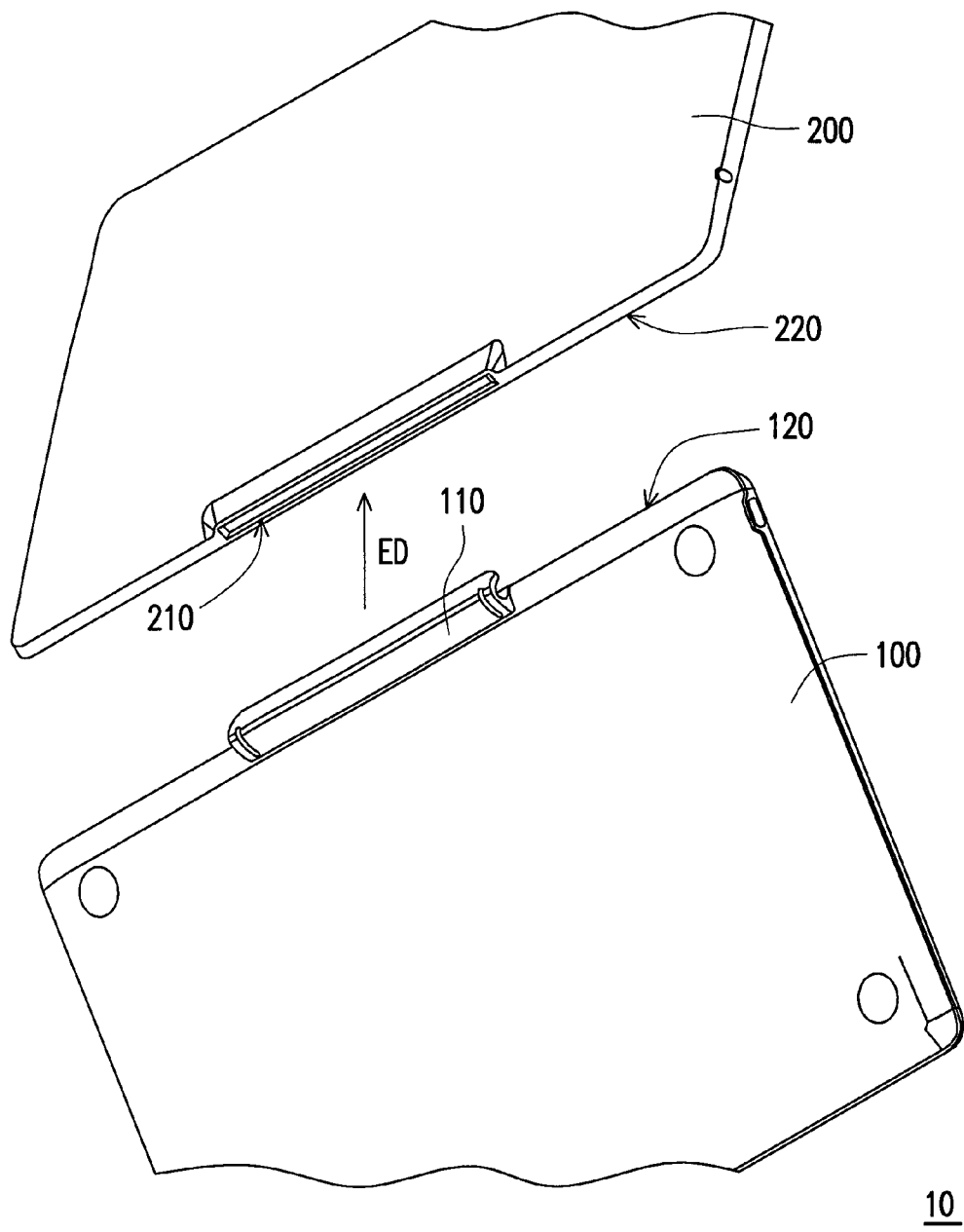
FIG. 3 is a schematic diagram showing an electronic device in a first embodiment.

FIG. 3 is a schematic diagram showing an electronic device in a first embodiment. As shown in FIG. 3, the guiding module 210 can be applied to an electronic device 10 in the embodiment. The electronic device 10 includes a first body 100 and a second body 200. The first body 100 includes a first connecting side 120 and an embedding part 110. The embedding part 110 is disposed at the first connecting side 120 and protrudes from the first connecting side 120.

The second body 200 includes a guiding module 210 and a second connecting side 220, and the guiding module 210 is disposed in the second body 200 and at the second connecting side 220. In the embodiment, the embedding part 110 represents the object 110 in the previous embodiments, and it is embedded to the second body 200 via the guiding module 210. The first body 100 may be a keyboard module, and the second body 200 may be a tablet computer. The guiding module 210 is disposed in the tablet computer to guide the keyboard module to insert to the tablet computer.

The guiding module 210 includes a body 212, a pair of sliding rails 214 and a guiding component 216, as shown in FIG. 1. The body 212 has an opening 212a. An embedding part 110 passes through the opening 212a along an embedding direction ED and is embedded to the second body 200. The sliding rail 214 is disposed at the body 212 and extends to the second body 200 along the embedding direction ED. The sliding rails 214 are disposed at two opposite sides of the opening 212a, respectively.

The guiding component 216 is slidably disposed at the sliding rails 214 and can move back and forth along the sliding rail 214. The guiding component 216 has an alignment region A1 which includes at least a first magnetic component 216a. The embedding part 110 at the alignment region A1 is magnetically attracted by the first magnetic component 216a, and the embedding part 110 is embedded to the second body 200 through the opening 212a.

In the embodiment referring to the FIG. 1 and FIG. 3, the electronic device 10 includes at least a second magnetic component 130 corresponding to the first magnetic component 216a, the second magnetic component 130 is disposed at the embedding part 110 facing a surface of the guiding component 216, and the second magnetic component 130 is magnetically attracted by the first magnetic component 216a to guide the embedding part 110 to pass through the opening 212a and insert therewith.

A material of the surface of the embedding part 110 facing the guiding component 216 includes magnetic material, which is not limited herein. In this way, the second magnetic component 130 is not needed embedding, and the embedding part 110 is guided to the opening 212a and is embedded to the second body 200 via the attraction between the first magnetic component 216a and the magnetic material.

The guiding module 210 may further include a pair of stoppers 218 disposed at the sliding rails 214, and each stopper 218 is disposed at one end of the sliding rail 214 away from the body 212. Thus, the guiding component 216 is slidably disposed at the sliding rail 214 and can move back and forth between the body 212 and the stopper 218. When the embedding part 110 passes through the opening 212a along the embedding direction ED to push the guiding component 216 to move, the guiding component 216 is stopped by the stopper 218 to stop sliding towards the second body 200, which makes the embedding part 110 locates at the embedding position.

The embedding part 110 of the first body 100 aligns to the opening 212a via the magnetic component of the guiding component 216, and since the guiding component 216 is disposed at the other side of the opening 212a, the embedding part 110 passes through the opening 212a and slides to the embedding position to be embedded to the second body 200 via the guiding component 216. When the first body 100 is pulled away from the second body 200, the guiding module 210 automatically restores to the original state due to the magnetic attraction force between the magnetic component and the embedding part 110, so as to guide the embedding part 110 when the embedding part 110 passes through the opening 212a of the guiding module 210 next time.

Figure 4:
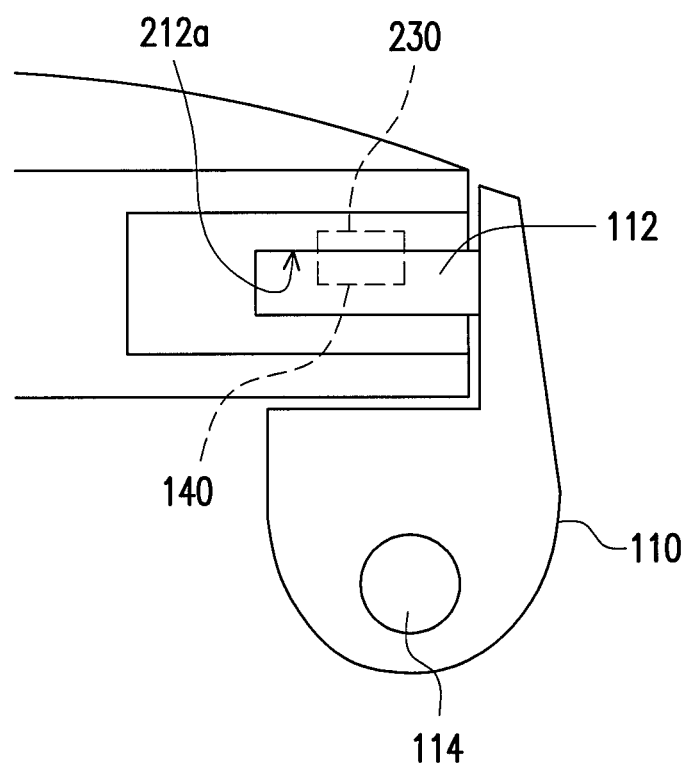
FIG. 4 is a partial schematic diagram showing an electronic device in a first embodiment.

FIG. 4 is a partial schematic diagram showing an electronic device in a first embodiment. Refer to FIG. 3 and FIG. 4, the embedding part 110 includes a pivot 114 and a locking component 112. The pivot 114 is pivotally disposed at a first connecting side 120, which makes the embedding part 110 rotate relatively to the first body 100. The locking component 112 is connected to the pivot 114 and protrudes from the first connecting side 120, so as to pass through the opening 212a and embedded to the second body 200 via the guiding component 216.

The embedding part 110 further includes a first electronic connector 140 disposed at the locking component 112, and a corresponding second electronic connector 230 is disposed at the inside wall of the opening 212a correspondingly. When the locking component 112 is embedded to the opening 212a, the first electronic connector 140 contacts with the second electronic connector 230, and the first body 100 is electrically connected to the second body 200.

Moreover, the locking component 112 is locked to the inside wall of the opening 212a in various ways. For example, the locking component 112 and the opening 212a include a locking structure, respectively, to fix the locking component 112 in the opening 212a. Thus, the connection between the first body 100 and the second body 200 is fixed, and the first body 100 rotates relative to the second body 200 via the pivot 114 of the embedding part 110.

Figure 5A:
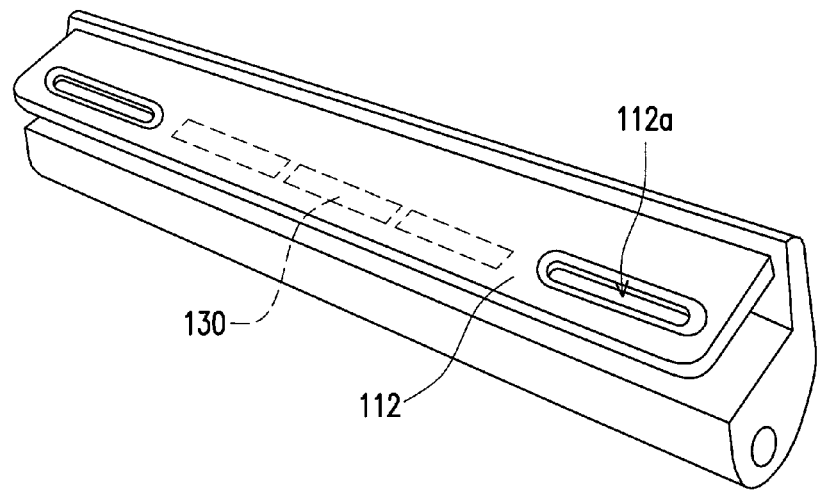
FIG. 5A is a schematic diagram showing an embedding part in a first embodiment.
Figure 5B:
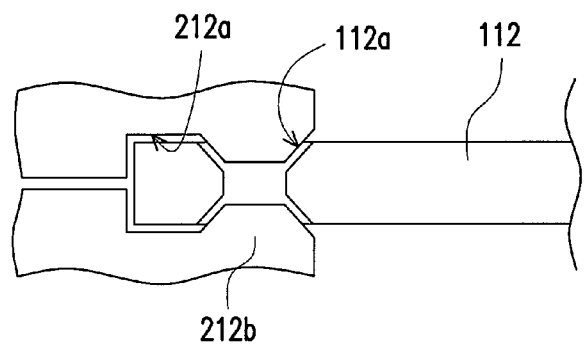
FIG. 5B is a sectional diagram showing that a locking component is locked to an opening in a first embodiment.

FIG. 5A is a schematic diagram showing an embedding part in a first embodiment, FIG. 5B is a sectional diagram showing that a locking a locking component is locked to an opening in a first embodiment. Refer to FIG. 5A and FIG. 5B, in the embodiment, the locking component 112 has a positioning hole 112a, and a hook 212b is formed at the inside wall of the opening 212a. When the locking component 112 is embedded to the opening 212a, the hook 212b interferes with the positioning hole 112a to fix the locking component 112 in the opening 212a. The positioning hole 112a may have an arc chamfering angle to help the hook 212b to be embedded to the positioning hole 112a smoothly, and the appearance of the locking component 112 is more beautiful.

Figure 6A:
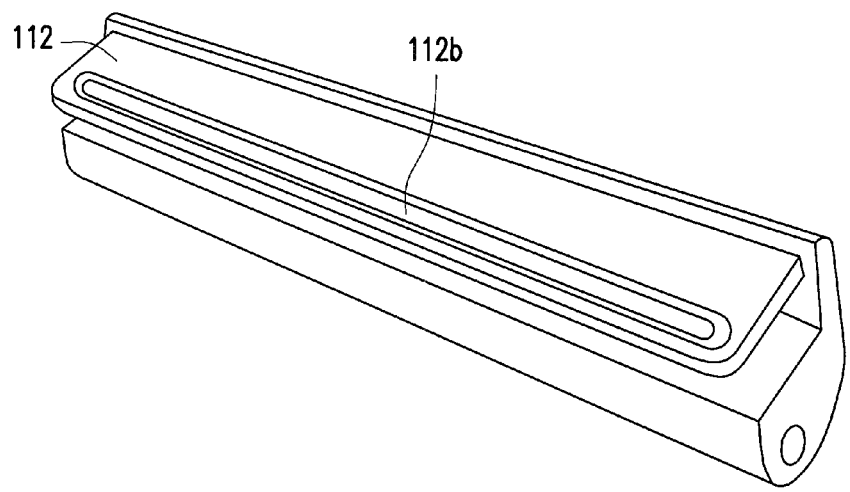
FIG. 6A is a schematic diagram showing an embedding part in a second embodiment.
Figure 6B:
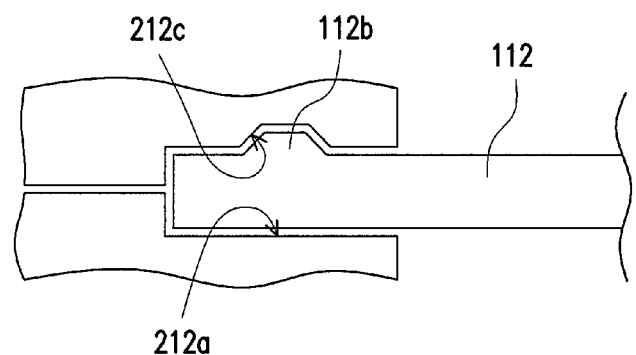
FIG. 6B is a sectional diagram showing that a locking component is locked to an opening in a second embodiment.

FIG. 6A is a schematic diagram showing an embedding part in a second embodiment, FIG. 6B is a sectional diagram showing that a locking component is locked to an opening in a second embodiment. Refer to FIG. 6A and FIG. 6B, in the embodiment, the positioning structures of the locking component 112 and the opening 212a can be exchanged. In other words, the locking component 112 includes a hook 112b, and a corresponding positioning hole 212c is formed at the inside wall of the opening 212a. When the locking component 112 is embedded to the opening 212a, the hook 212b and the positioning hole 112a form an interference structure to fix the locking component 112 in the opening 212a. In this way, it does not need to form a hole at the locking component 112, which makes the locking component 112 look better.

Figure 7A:
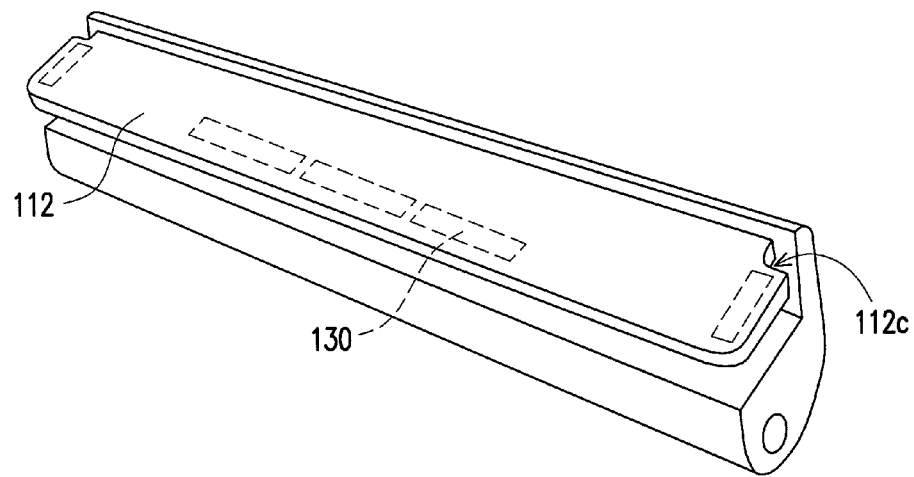
FIG. 7A is a schematic diagram showing an embedding part in a third embodiment.
Figure 7B:
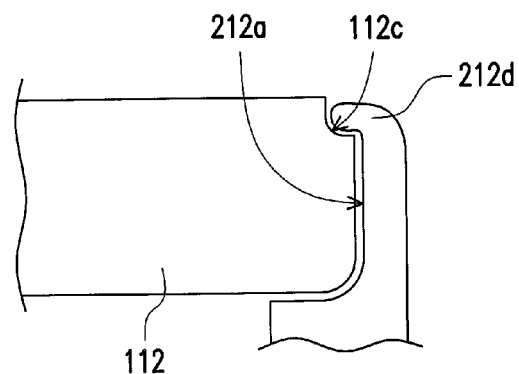
FIG. 7B is a sectional diagram showing that a locking component is locked to an opening in a third embodiment.

FIG. 7A is a schematic diagram showing an embedding part in a third embodiment, and FIG. 7B is a sectional diagram showing that a locking component is locked to an opening in a third embodiment. Refer to the FIG. 7A and FIG. 7B, in the embodiment, a groove 112c is formed at two corresponding sides of the locking component 112, respectively, and a hook 212d is formed at the two corresponding sides of the inside wall of the opening 212a, respectively. When the locking component 112 is embedded to the opening 212a, the hook 212d and the groove 112c form an interference structure to fix the locking component 112 in the opening 212a. Since the hook 212d is disposed at the corresponding sides of the locking component 112, the locking component 112 has a better appearance. Furthermore, a magnetic component can be disposed at the corresponding sides of the locking component 112 and the opening 212a, respectively, which further firms the connection between the hook 212d and groove 112c.

Figure 8A:
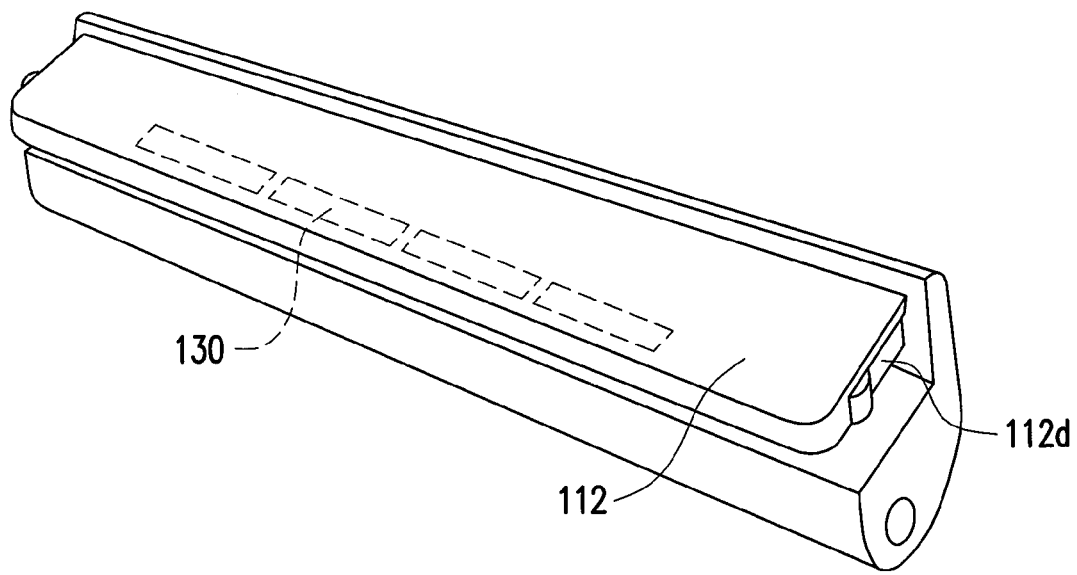
FIG. 8A is a schematic diagram showing an embedding part in a fourth embodiment.
Figure 8B:
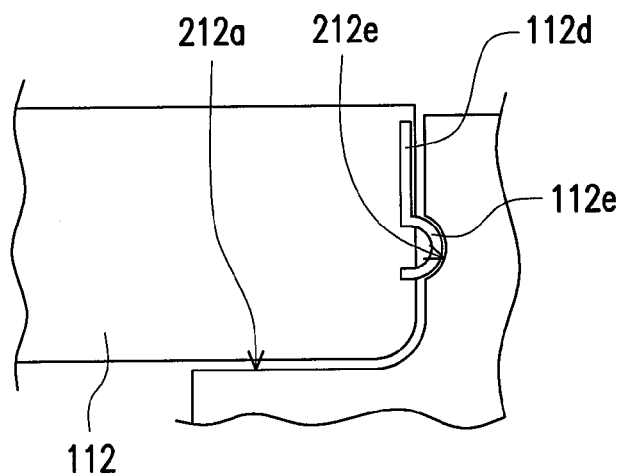
FIG. 8B is a sectional diagram showing that a locking component is locked to an opening in a fourth embodiment.

FIG. 8A is a schematic diagram showing an embedding part in a fourth embodiment, FIG. 8B is a sectional diagram showing that a locking component is locked to an opening in a fourth embodiment, a flexible sheet 112d is disposed at two corresponding sides of the locking component 112, respectively, and each flexible sheet 112d has a positioning protruding part 112e. A groove 212e is formed at two corresponding sides of the inside wall of the opening 212a, respectively. When the locking component 112 is embedded to the opening 212a, the positioning protruding part 112e and the groove 212e form an interference structure to fix the locking component 112 in the opening 212a. Since the flexible sheet 112d is disposed at the corresponding sides of the locking component 112, the locking component 112 has a better appearance.

Figure 9A:
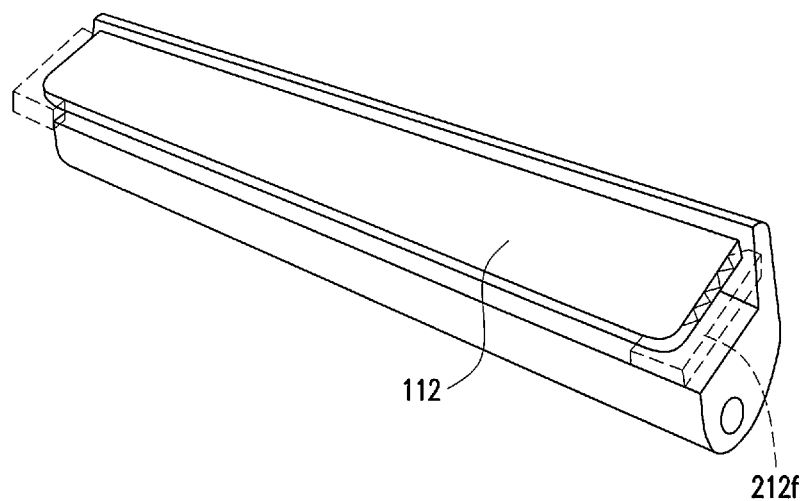
FIG. 9A is a schematic diagram showing an embedding part in a fifth embodiment.
Figure 9B:
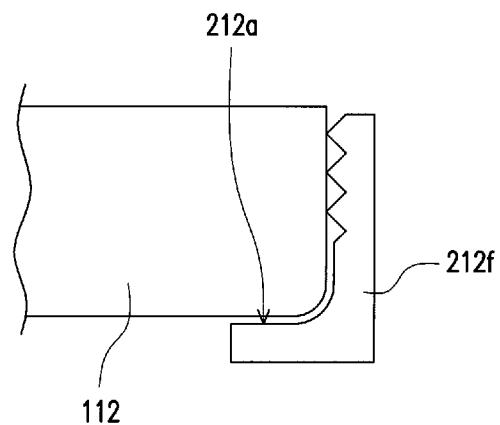
FIG. 9B is a sectional diagram showing that a locking component is locked to an opening in a fifth embodiment.

FIG. 9A is a schematic diagram showing an embedding part in a fifth embodiment, FIG. 9B is a sectional diagram showing that a locking component is locked to an opening in a fifth embodiment, at least the two corresponding sides of the inside wall of the opening 212a are wrapped with a flexible material 212f to increase the friction between the opening 212a and the locking component 112 and prevent the locking component 112 from being scratched. A material of the elastic material 212f can be a rubber, which is not limited herein. The contact surface of the elastic material 212f and the locking component 112 is a non-planar, such as a jagged surface shown in the FIG. 9B, to further increase the friction between the opening 212a and the locking component 112. The method can be combined with the locking method in the previous embodiments, which improves the locking stability between the locking component 112 and the opening 212a.

Figure 10A:
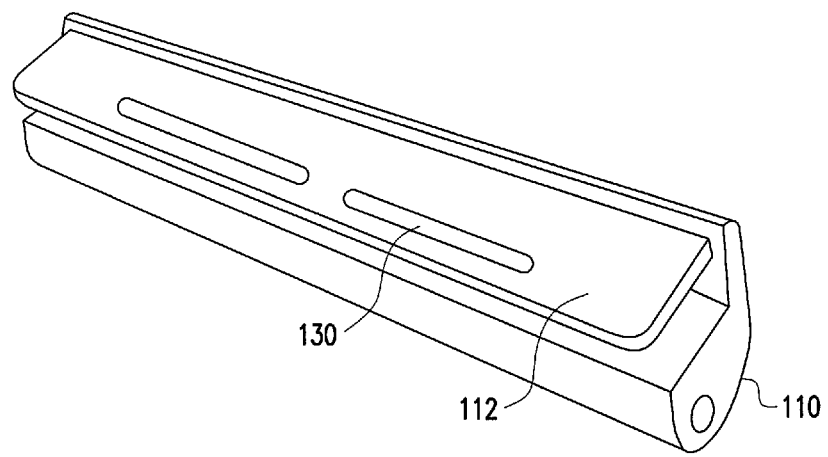
FIG. 10A is a schematic diagram showing an embedding part in a sixth embodiment.
Figure 10B:
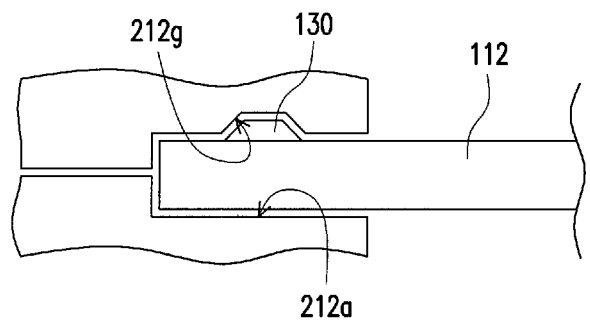
FIG. 10B is a sectional diagram showing that a locking component is locked to an opening in a sixth embodiment.

FIG. 10A is a schematic diagram showing an embedding part in a sixth embodiment, FIG. 10B is a sectional diagram showing that a locking component is locked to an opening in a sixth embodiment, the second magnetic component 130 is disposed at the locking component 112 and protrudes from the surface of the locking component 112, a corresponding groove 212g is formed at the inside wall of the opening 212a, and when the locking component 112 is embedded to opening 212a, the second magnetic component 130 and the groove 212g form an interference structure to fix the locking component 112 in the opening 212a. In other words, the second magnetic component 130 in the embodiment guides the locking component 112 to the opening 212a via the magnetic attraction force of the first magnetic component, and it is locked to the groove 212g of the opening 212a to fix the locking component 112 in the opening 212a more firmly.

Figure 11A:
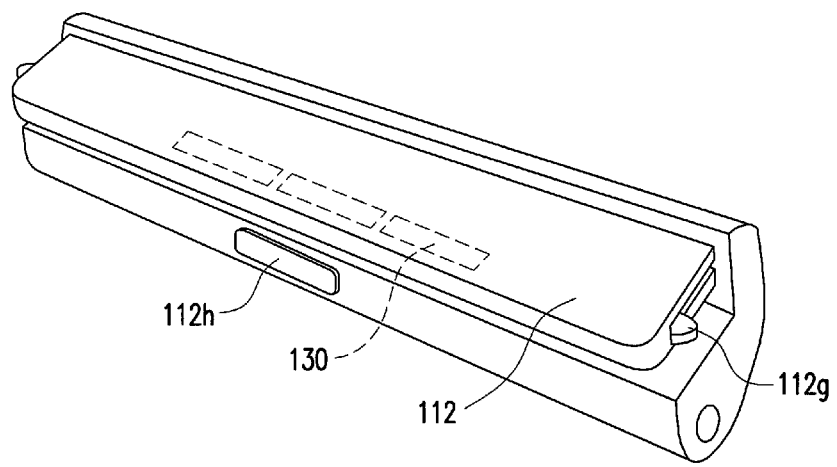
FIG. 11A is a schematic diagram showing an embedding part in a seventh embodiment.
Figure 11B:
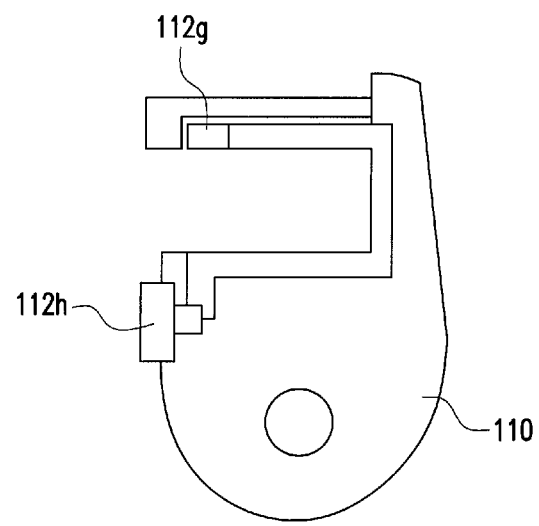
FIG. 11B is a sectional diagram showing the embedding part in a seventh embodiment.

FIG. 11A is a schematic diagram showing an embedding part in a seventh embodiment, FIG. 11B is a sectional diagram showing the embedding part in a seventh embodiment, the embedding part 110 further includes a hook 112g and a control button 112h. A groove corresponding to the hook 112g is formed at the two corresponding sides of the opening, respectively, as shown in the FIG. 8B. The hook 112g is disposed at the two corresponding sides of the locking component 112, and the control button 112h controls the hook 112g to protrude or hide from the two corresponding sides of the locking component 112 to form or release the interference structure with the groove.

Figure 12:
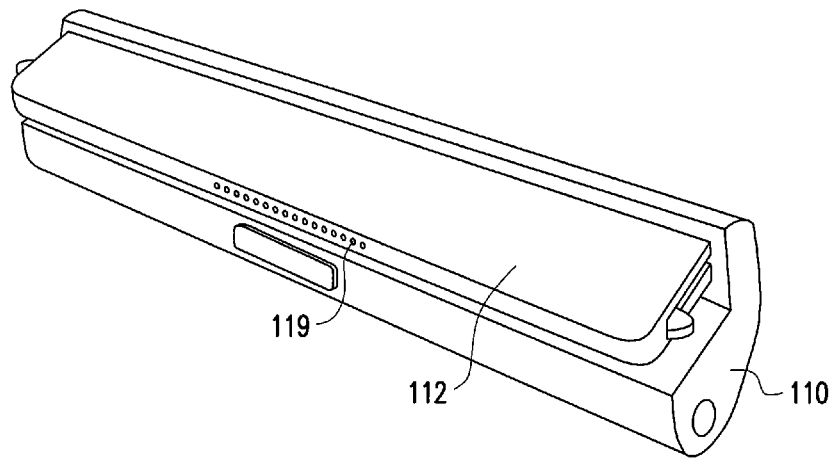
FIG. 12 is a schematic diagram showing an embedding part in an eighth embodiment.
Figure 13:
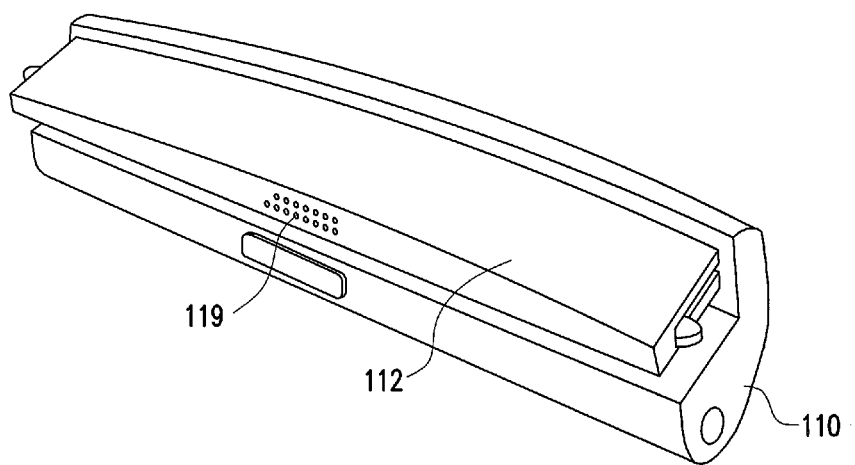
FIG. 13 is a schematic diagram showing an embedding part in a ninth embodiment.

FIG. 12 is a schematic diagram showing an embedding part in an eighth embodiment, FIG. 13 is a schematic diagram showing an embedding part in a ninth embodiment. Refer to FIG. 12, in the embodiment, the embedding part 110 further includes multiple signal pins 119 disposed on the locking component 112. When the locking component 112 passes through the opening, the signal pins 119 are electronically connected to multiple driving signal lines of the second body, and the second body can transfer signals with the first body. The locking component 112 may have various appearances according to the design requirements of the products. For example, the embedding surface of the locking component 112 and the opening is an arc surface, as shown in FIG. 13.

In sum, a magnetic guiding component is slidably disposed at a body, and the body has an opening. The object magnetically attracted by the guiding component is guided by the magnetic force to pass through the opening and pushes the guiding component to slide to an embedding position, which can avoid the problem that the object aligns to the opening difficultly or the object only aligns to the outside surface of the opening and cannot be guided to the opening effectively. An electronic device using the guiding module is provided, which guides an embedding part of a first body to pass through an opening of a second body and embedded thereto.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A guiding module adapted for guiding an object to pass through an opening of the guiding module, the guiding module comprising:
    a body including the opening, wherein the object passes through the opening along an embedding direction and is embedded thereto;
    a pair of sliding rails disposed at the body and extending along the embedding direction; and
    a guiding component slidably disposed at the sliding rails and having an alignment region, wherein the alignment region includes at least one first magnetic component;
    wherein when the object approaches the opening, the object at the alignment region is magnetically attracted by the first magnetic component to make the object embedded to the body through the opening.

2. The guiding module according to claim 1, wherein the object includes at least one second magnetic component disposed at a surface of the object facing the guiding component and corresponding to the first magnetic component, and the second magnetic component is magnetically attracted by the first magnetic component.

3. The guiding module according to claim 1, wherein a material of the surface of the object facing the guiding component includes a magnetic material.

4. The guiding module according to claim 1, wherein the guiding module further includes a pair of stoppers disposed on the pair of sliding rails respectively, each of the stoppers is disposed at one end of the sliding rail away from the body, and when the first magnetic component attracts the object to the alignment region and the object is embedded to the opening, the object passes through the opening along the embedding direction and pushes the guiding component to move and abut against the stopper, and the object locates at an embedding position.

5. An electronic device comprising:
    a first body including an embedding part and a first connecting side, wherein the embedding part is disposed at the first connecting side and protrudes from the first connecting side; and
    a second body including a guiding module and a second connecting side, wherein the guiding module is disposed in the second body and disposed at the second connecting side, and the guiding module includes:
        a body including an opening, wherein the embedding part passes through the opening along an embedding direction and is embedded to the second body;
        a pair of sliding rails disposed at the body and extending along the embedding direction to the opening; and
        a guiding component slidably disposed at the sliding rails and having an alignment region which includes at least one first magnetic component;
        wherein when the object approaches the opening, the embedding part at the alignment region is magnetically attracted by the first magnetic component to make the embedding part embedded to the second body through the opening.

6. The electronic device according to claim 5, wherein the electronic device further includes at least a second magnetic component, the second component is disposed at a surface of the embedding part facing the guiding component and corresponding to the first magnetic component, and the second magnetic component is magnetically attracted by the first magnetic component.

7. The electronic device according to claim 5, wherein a material of the surface of the embedding part facing the guiding component includes a magnetic material.

8. The electronic device according to claim 5, wherein the guiding module further includes a pair of stoppers disposed on the pair of sliding rails respectively, each of the stoppers is disposed at one end of the sliding rail away from the body, and when the first magnetic component attracts the embedding part to the alignment region and the embedding part is embedded to the opening, the embedding part passes through along the embedding direction and pushes the guiding component to move until it abuts against the stopper, and the embedding part locates at an embedding position.

9. The electronic device according to claim 5, wherein the embedding part includes a pivot and a locking component, the pivot is disposed at the first connecting side which makes the embedding part rotate with the pivot against the first body, the locking component is connected to the pivot and protrudes from the first connecting side to embedded to the second body through the opening.

10. The electronic device according to claim 9, wherein the locking component includes a positioning hole, the opening includes a hook, and when the locking component passes through the opening, the hook interferes with the positioning hole to fix the locking component in the opening.

11. The electronic device according to claim 9, wherein the locking component includes a hook, the opening includes a positioning hole, when the locking component passes through the opening, the hook interferes with the positioning hole to fix the locking component in the opening.

12. The electronic device according to claim 9, wherein a groove is formed at two corresponding sides of the locking component, respectively, a hook is formed at two corresponding sides of the opening, respectively, and when the locking component passes through the opening, the hook interferes with the groove to fix the locking component in the opening.

13. The electronic device according to claim 9, wherein a flexible sheet is disposed at two corresponding sides of the locking component, respectively, each of the flexible sheets includes a positioning protruding part, a groove is formed at two corresponding sides of the opening, respectively, and when the locking component passes through the opening, the positioning protruding part interferes with the groove to fix the locking component in the opening.

14. The electronic device according to claim 9, wherein at least the two corresponding sides in the opening are wrapped with a flexible material.

15. The electronic device according to claim 14, wherein the flexible material includes a rubber.

16. The electronic device according to claim 6, wherein the second magnetic component is disposed at the locking component and protrudes from the surface of the locking component, the opening includes at least a groove, and when the locking component passes through the opening, the second magnetic component interferes with the groove to fix the locking component in the opening.

17. The electronic device according to claim 9, wherein a groove is formed at two corresponding sides of the opening, respectively, the embedding part further includes a hook and a control button, the hook is disposed at two corresponding sides of the locking component, and the control button is used to control the hook to protrude from or hide from the two corresponding sides of the locking component to form or release the interference with the groove.

18. The electronic device according to claim 9, wherein the embedding part includes a first electronic connector disposed at the locking component, the opening includes a second electronic connector, and when the locking component passes through the opening, the first electronic connector is electronically connected to the second electronic connector.

19. The electronic device according to claim 9, wherein the embedding part includes multiple signal pins disposed at the locking component, and when the locking component passes through the opening, the signal pins are electronically connected to multiple driving signal lines of the second body respectively.

20. The electronic device according to claim 19, wherein an embedding surface between the locking component and the opening is an arc surface.

* * * * *